United States Patent
Kang et al.

(10) Patent No.: US 12,416,676 B2
(45) Date of Patent: Sep. 16, 2025

(54) BATTERY PACK STATE OF CHARGE ESTIMATION

(71) Applicant: GM Global Technology Operations LLC, Detroit, MI (US)

(72) Inventors: Jun-mo Kang, Ann Arbor, MI (US); Hanho Yun, Oakland Township, MI (US); Insu Chang, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 195 days.

(21) Appl. No.: 18/350,484

(22) Filed: Jul. 11, 2023

(65) Prior Publication Data
US 2025/0020723 A1   Jan. 16, 2025

(51) Int. Cl.
*G01R 31/367* (2019.01)
*B60L 50/60* (2019.01)
*B60L 58/12* (2019.01)
*G01R 31/3835* (2019.01)

(52) U.S. Cl.
CPC ............ *G01R 31/367* (2019.01); *B60L 50/60* (2019.02); *B60L 58/12* (2019.02); *G01R 31/3835* (2019.01)

(58) Field of Classification Search
CPC .... G01R 31/367; G01R 31/3835; B60L 58/12
See application file for complete search history.

(56) References Cited

U.S. PATENT DOCUMENTS

| | | | |
|---|---|---|---|
| 8,102,146 B2 * | 1/2012 | Suzuki | G01R 31/367 320/132 |
| 9,531,039 B2 * | 12/2016 | Heubner | H01M 50/569 |
| 2018/0313900 A1 | 11/2018 | Koga et al. | |

FOREIGN PATENT DOCUMENTS

| | | | | |
|---|---|---|---|---|
| DE | 102015211598 A1 | * | 12/2016 | |
| KR | 2021062263 A | * | 5/2021 | |
| WO | WO-2024063337 A1 | * | 3/2024 | B60L 58/12 |

OTHER PUBLICATIONS

German Application No. 10 2023 127 379.5; German Office Action dated Apr. 11, 2024; 8 pages.

* cited by examiner

*Primary Examiner* — Walter L Lindsay, Jr.
*Assistant Examiner* — Milton Gonzalez
(74) *Attorney, Agent, or Firm* — CANTOR COLBURN LLP (57) ABSTRACT

A battery monitoring system for a vehicle includes a processor and a memory. The memory stores instructions for causing the processor to estimate a state of charge of a battery based on a current cell pressure of the battery while the state of charge of the battery is below a threshold state of charge and to estimate a state of charge of the battery based on a voltage output by the battery while the state of charge of the battery is greater than or equal to the threshold state of charge.

20 Claims, 7 Drawing Sheets

BATTERY PACK STATE OF CHARGE ESTIMATION

INTRODUCTION

The subject disclosure relates to a method and system for actively managing a pressure of a lithium metal battery pack or similar battery pack.

Vehicles, including gasoline and diesel powered vehicles, as well as electric and hybrid electric vehicles, feature battery powered energy storage for purposes such as powering electric motors, electronics and other vehicle subsystems. Vehicle battery systems may be charged using power sources such as charging stations, other electric vehicle battery systems and/or an electrical grid. While operating vehicle systems that utilize battery power, the current state of charge (SoC) of the battery is used by the controller to ensure that sufficient battery power remains for optimal performance of the vehicle systems relying on the battery. Direct measurement of the state of charge is not feasible within an operating vehicle, and most vehicles rely on an extrapolated, or estimated, SoC.

Current SoC estimation techniques rely on a voltage measurement of the battery as the sole measurement from which the SoC is estimated. During most operational states, this estimation is close enough to accurately be utilized. However, the estimation breaks down at extremely low charge levels (e.g., when the battery is close to full discharge) as the voltage based estimation has difficulty accounting for the age of the battery pack.

Accordingly, it is desirable to provide a battery monitoring system that accurately estimates the SoC throughout a full charge/discharge cycle accounting for the age of the battery pack.

SUMMARY

In one exemplary embodiment a battery monitoring system for a vehicle includes a processor and a memory, the memory storing instructions for causing the processor to estimate a state of charge of a battery based on a current cell pressure of the battery while the state of charge of the battery is below a threshold state of charge and to estimate a state of charge of the battery based on a voltage output by the battery while the battery is greater than or equal to the threshold state of charge.

In addition to one or more of the features described herein estimating the state of charge of the battery based on the current cell pressure comprises estimating the state of charge based on a rate of change of the current cell pressure.

In addition to one or more of the features described herein the memory stores instructions configured to cause the processor to learn a cell pressure bias across multiple iterations.

In addition to one or more of the features described herein the current cell pressure is directly monitored.

In addition to one or more of the features described herein the current cell pressure is derived from at least one related sensor reading.

In addition to one or more of the features described herein the battery is a lithium metal battery.

In addition to one or more of the features described herein estimating the state of charge of the battery based on the current cell pressure of the battery includes estimating via a first procedure while the battery is charging, and estimating via a second procedure when the battery is discharging.

In addition to one or more of the features described herein the first procedure includes estimating the state of charge using a voltage based state of charge estimator and estimating a state of charge using a cell pressure base state of charge estimator, comparing the voltage based state of charge estimation and the cell pressure based state of charge estimation, and determining that the voltage based state of charge is accurate when a difference between the voltage based state of charge estimation and the cell pressure based state of charge estimation is below a threshold, and determining that the voltage based state of charge is inaccurate when the difference between the voltage based state of charge estimation and the cell pressure based state of charge estimation is greater than or equal to the threshold.

In addition to one or more of the features described herein the first procedure further comprises learning a bias and slope of a cell pressure in response to determining that the voltage based state of charge estimate is accurate, and applying the learned bias and slope of the cell pressure when estimating the state of charge using the cell pressure based state of charge estimator.

In addition to one or more of the features described herein the second procedure includes pre-calculating a slope a and bias b of the current cell pressure of the battery, determining a current cell pressure of the battery cell pressure Prcrt, calculating a pressure increase due to irreversible expansion ($\Delta cp$), adjusting the measured pressure according to Pradj=Prcrt−$\Delta cp$ and calculating a state of charge (SOC) according to SOC=(Pradj−b)/a.

In another exemplary embodiment a method for estimating a state of charge of a battery includes estimating a state of charge of a battery based on a current cell pressure of the battery while the state of charge of the battery is below a threshold state of charge and estimating a state of charge of the battery based on a voltage output by the battery while the battery is greater than or equal to the threshold state of charge.

In addition to one or more of the features described herein estimating the state of charge of the battery based on the current cell pressure comprises estimating the state of charge based on a rate of change of the cell pressure.

In addition to one or more of the features described herein further includes learning a cell pressure bias across multiple iterations of the process and storing the learned cell pressure bias in a memory.

In addition to one or more of the features described herein the battery is a lithium metal battery.

In addition to one or more of the features described herein estimating a state of charge of a battery based on a current cell pressure of the battery while the state of charge of the battery is below a threshold state of charge comprises estimating the state of charge of the battery via a first procedure while the battery is charging, and estimating the state of charge of the battery via a second procedure when the battery is discharging.

In addition to one or more of the features described herein the first procedure includes estimating the state of charge using a voltage based state of charge estimator and estimating the state of charge using a cell pressure base state of charge estimator, comparing the voltage based state of charge estimation and the cell pressure based state of charge estimation, and determining that the voltage based state of charge is accurate when a difference between the voltage based state of charge estimation and the cell pressure based state of charge estimation is below a threshold, and determining that the voltage based state of charge is inaccurate when the difference between the voltage based state of charge estimation and the cell pressure based state of charge estimation is greater than or equal to the threshold.

In addition to one or more of the features described herein the first procedure further comprises learning a bias and slope of a cell pressure in response to determining that the voltage based estimate is accurate, and applying the learned bias and slope of the cell pressure when estimating the state of charge using the cell pressure based estimator.

In addition to one or more of the features described herein the second procedure includes pre-calculating a slope a and bias b of the battery cell pressure, determining a current battery cell pressure Prcrt, calculating a pressure increase due to irreversible expansion (Δcp), adjusting a measured pressure according to Pradj=Prcrt−Δcp and calculating a state of charge (SOC) according to SOC=(Pradj−b)/a.

In yet another exemplary embodiment a vehicle includes a propulsion system including at least one electric motor, a battery system comprising a cell based battery and a battery monitoring system, wherein the battery monitoring system includes a memory and a processor, the battery monitoring system being configured to perform the process of estimating a state of charge of a battery based on a current cell pressure of the battery while the state of charge of the battery is below a threshold state of charge and estimating a state of charge of the battery based on a voltage output by the battery while the battery is greater than or equal to the threshold state of charge.

In addition to one or more of the features described herein estimating the state of charge of the battery based on the current cell pressure of the battery includes estimating via a first procedure while the battery is charging, and estimating via a second procedure when the battery is discharging.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

The following description is merely exemplary in nature and is not intended to limit the present disclosure, its application or uses. It should be understood that throughout the drawings, corresponding reference numerals indicate like or corresponding parts and features. As used herein, the term module refers to processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

In accordance with an exemplary embodiment a battery monitoring system actively monitors battery parameters including both battery cell pressure and age of a lithium metal battery, or similar battery structure, and estimates the state of charge of the battery based on a change in battery pressure over time.

Figure 1:
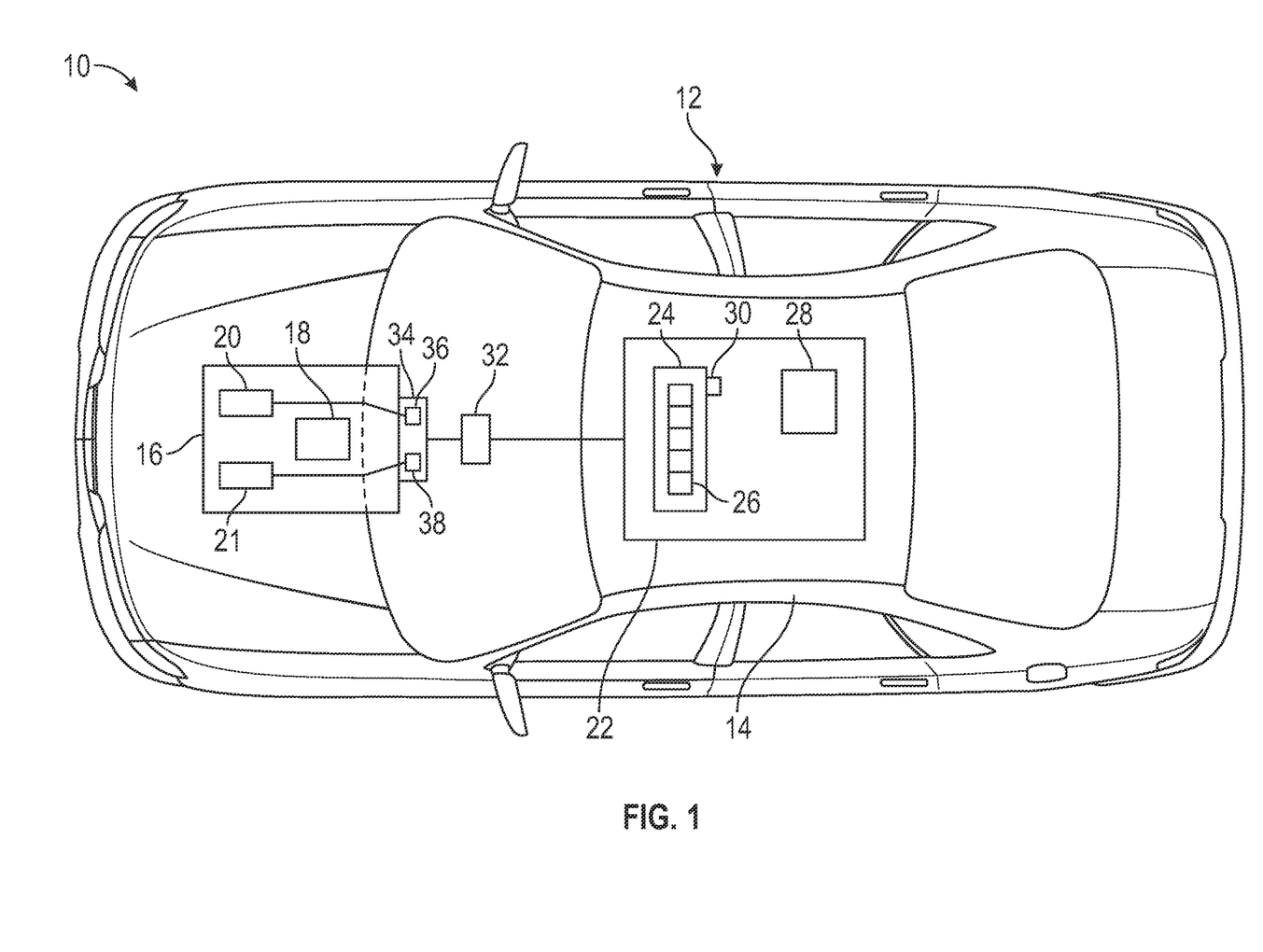
FIG. 1 is a schematic illustration of a vehicle.

FIG. 1 shows an embodiment of a motor vehicle 10, which includes a vehicle body 12 defining, at least in part, an occupant compartment 14. The vehicle body 12 also supports various vehicle subsystems including a propulsion system 16, and other subsystems to support functions of the propulsion system 16 and other vehicle components, such as a braking subsystem, a suspension system, a steering subsystem, a fuel injection subsystem, an exhaust subsystem and others.

The vehicle 10 may be a combustion engine vehicle, an electrically powered vehicle (EV) or a hybrid vehicle. In an embodiment, the vehicle 10 is a hybrid vehicle that includes a combustion engine system 18 and at least one electric motor system. For example, the propulsion system 16 includes a first electric motor 20 and a second electric motor 21. The motors 20 and 21 may be configured to drive wheels on opposing sides of the vehicle 10. Any number of motors positioned at various locations may be used.

The vehicle 10 includes a battery system 22, which may be electrically connected to the motors 20 and 21 and/or other components, such as vehicle electronics. The battery system 22 may be configured as a rechargeable energy storage system (RESS).

In an embodiment, the battery system 22 includes a battery assembly such as a high voltage battery pack 24 having a plurality of battery modules 26. Each of the battery modules 26 includes a number of individual cells arranged in battery packs. The battery system 22 may also include a monitoring system 28 (e.g., RESS controller) configured to receive measurements from sensors 30. Each sensor 30 may be an assembly or system having one or more sensors for measuring various battery and environmental parameters, such as temperature, battery pack gap distance, battery pack pressure, current, and voltage. The monitoring system 28 includes components such as a processor, memory, an interface, a bus and/or other suitable components.

The battery system 22 is electrically connected to a direct current (DC)-DC converter module 32 and an inverter module 34. The inverter module 34 (e.g., a traction power inversion unit or TPIM) converts direct current (DC) power from the battery assembly to three-phase alternating current (AC) power to drive the motors. In an embodiment, the inverter module 34 includes a first inverter 36 connected to the motor 20, and a second inverter 38 connected to the motor 21.

In some embodiments the battery modules 26 are constructed of lithium metal battery cells, or similar styles of battery cells. During operation of the vehicle, as the battery cells charge and discharge (referred to as charging/discharging cycles) the pressure in each battery cell changes. During each charge/discharge cycle a majority of the pressure increase is reversible, however a portion is irreversible. The irreversible pressure changes result in an upward creep on battery pack pressure as the battery pack ages.

Figure 2:
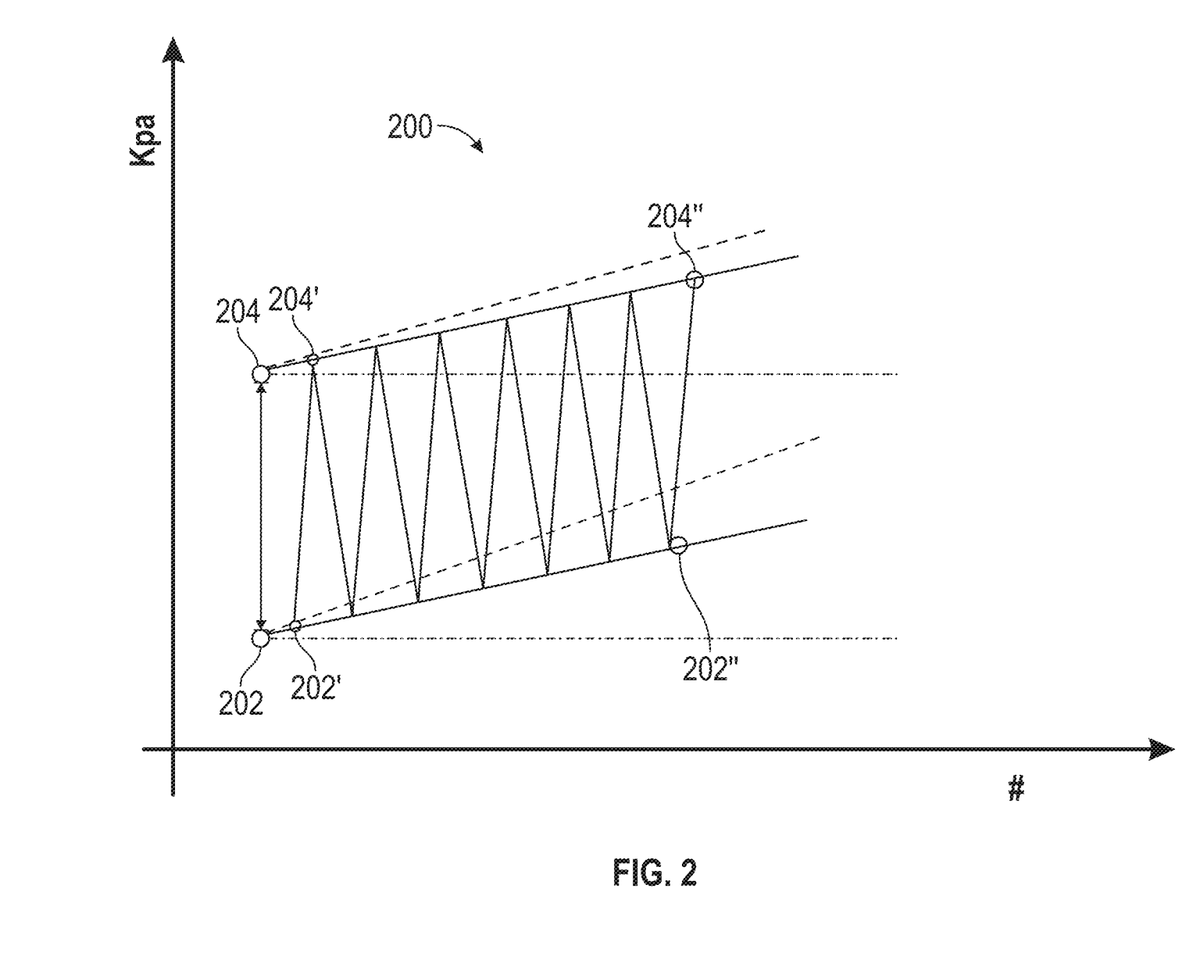
FIG. 2 is a chart illustrating a reversible pressure window for an exemplary battery cell.

With continued reference to FIG. 1, FIG. 2, illustrates a chart 200 showing the expansion of a given battery cell across multiple cycles, with the vertical axis representing a cell pressure, and the horizontal axis representing a number of charge/discharge cycle. A fresh battery pack (e.g. at charge/discharge cycle number zero), starts with a pressure at a minimum pressure value 202. As the pressure increases during a charge/discharge cycle, the pressure approaches a maximum reversible pressure value 204. The distance between the minimum pressure 202 and the maximum reversible pressure 204 is referred to as the reversible pressure window. Any pressure increase beyond the maximum reversible value is irreversible, and shifts the minimum and maximum pressure 202, 204 up by the irreversible amount to new positions 202', 204'. Across multiple cycles the reversible pressure window gets shifted upward, as can be seen at 202" and 204".

Figure 5:
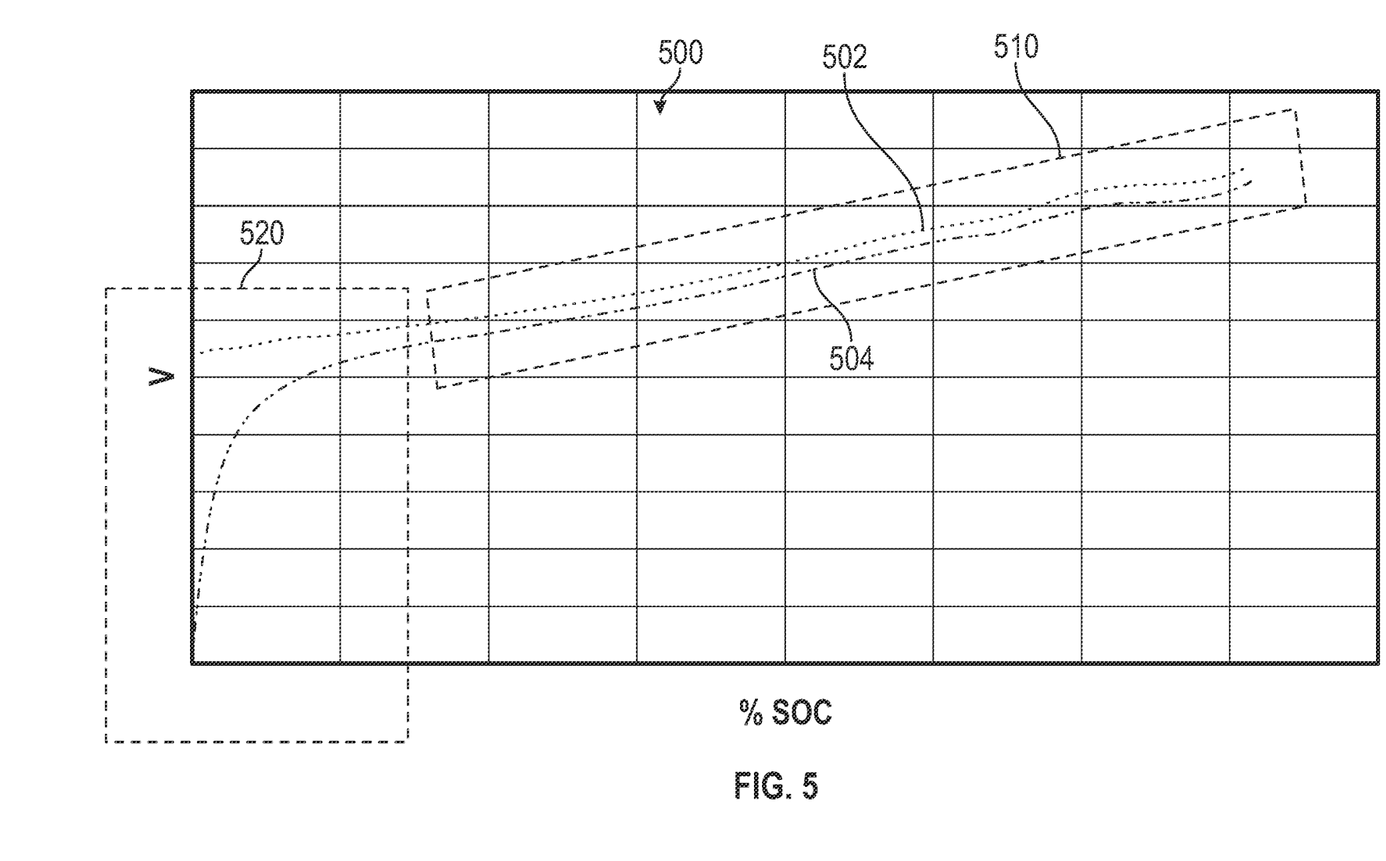
FIG. 5 is a chart illustrating the voltage with respect to charge capacity at an extremely low state of charge.

Conventionally, the state of charge of the battery is estimated based solely on feedback of a voltage measurement of the battery. Voltage based estimation methods are established in the art. While this estimation provides sufficiently accurate estimates over most of the charge window, the voltage based estimation can be inaccurate at extremely low states of charge. FIG. 5 illustrates an exemplary chart 500 illustrating a voltage on the vertical axis with respect to state of charge (SoC) on the horizontal axis. For a majority of the charging process the output voltage 502 tracks the output voltage 504 of the discharging process at almost one to one correspondence (see first region 510). The one to one correspondence allows for easy estimation based on the voltage measurement during charging and discharging processes. However, as the state of charge approaches zero (the second region 520), the voltage 502 dramatically diverges from the voltage 504, and the estimation is no longer accurate. To provide accurate estimates across all states of charge, the battery monitoring system 28 utilizes a combination of voltage based and cell pressure based estimation methods. As the characteristics of a charge process and a discharge process are distinct at the extremely low state of charge, including distinct state of charge estimation methods for the charge process and for the discharge process ensures accurate monitoring of the state of charge during each process. The accurate monitoring, in turn ensures that the charge state of the battery pack can be properly controlled without overcharging or allowing the battery pack 24 to be discharged below a desirable level.

Figure 3:
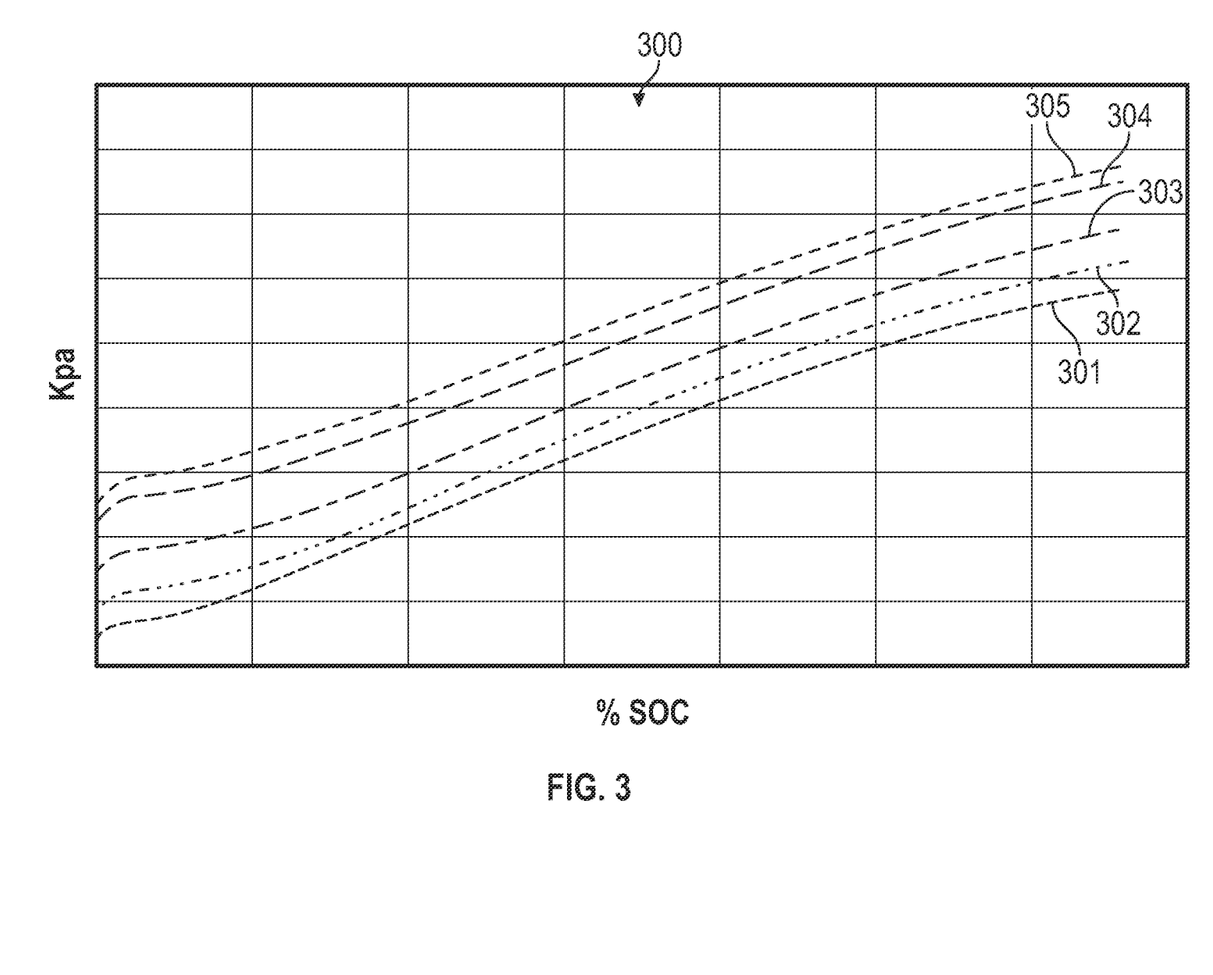
FIG. 3 is a chart illustrating battery cell pressures related to charge capacity during a charging operation.
Figure 4:
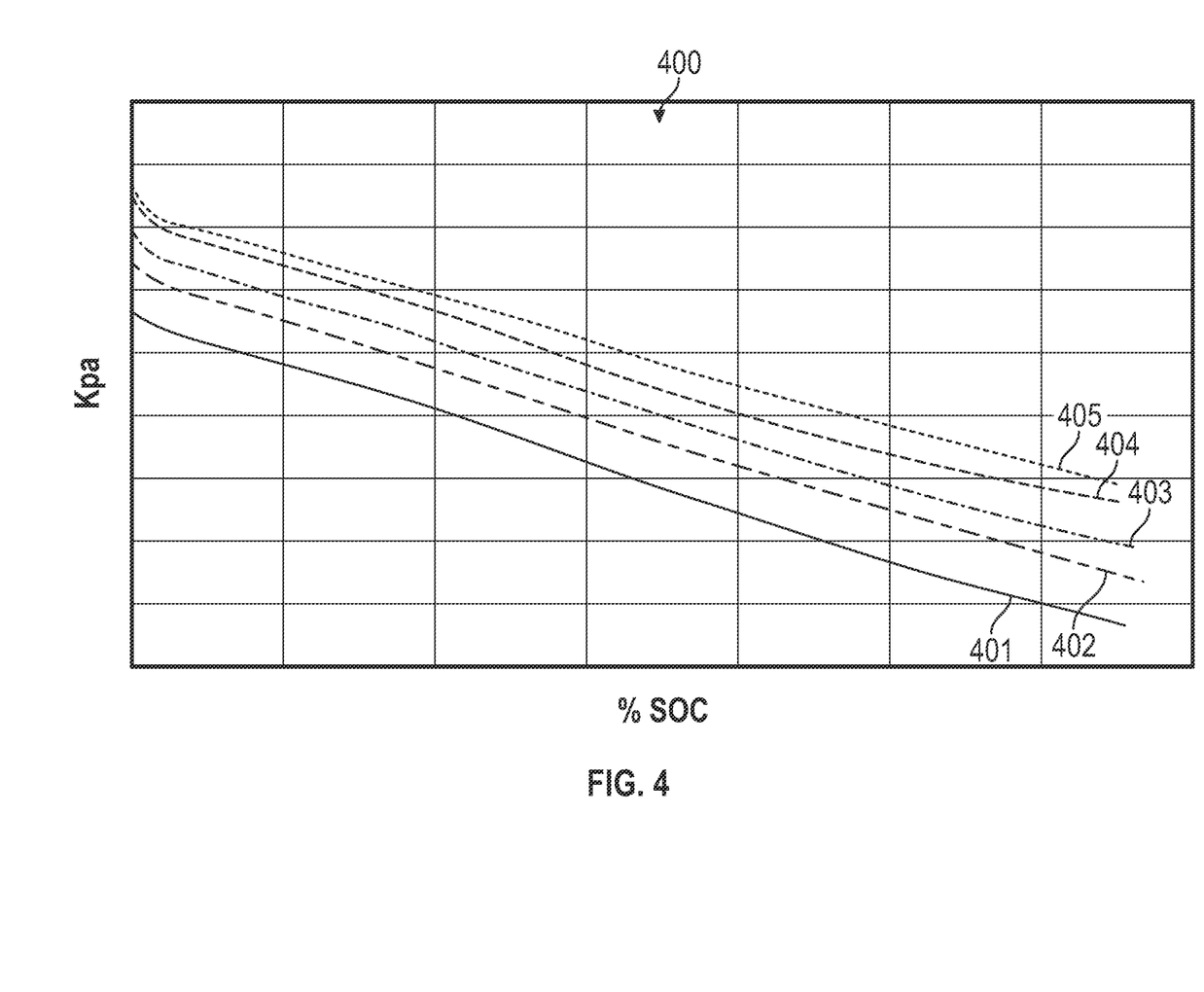
FIG. 4. is a chart illustrating battery cell pressures related to charge capacity during a discharging operation.

With continued reference to FIGS. 1 and 2, FIG. 3 illustrates a chart 300 of the battery pack cell pressure (vertical axis) with respect to the charge capacity of the battery pack (horizontal axis) over time during multiple charging operations 301-305. Similarly, FIG. 4 illustrates a chart 400 of a cell pressure of the battery pack (vertical axis) with respect to discharge capacity (horizontal axis) over time during multiple discharge operations 401-405. The vertical separation between each operation 301-305, 401-405 is exaggerated for illustrative effect, and a practical operation may have substantially larger quantities of charge/discharge operations.

Referring collectively to both charts 300, 400, each line represents a distinct charge/discharge operation. As the battery pack ages and experiences more charge/discharge operations, the starting and ending cell pressures shift upwards along the entire charge/discharge operation due to irreversible pressure increases. The upward shift is the bias due to irreversible pressure increases. However, the slope of the pressure change (i.e. the rate of change of the cell pressure) does not change from one operation to the next, and the slope of the pressure change is almost constant during discharging. Furthermore, the cell pressure can be directly measured using appropriate sensors within the sensor pack 30 and/or estimated with a high accuracy using conventionally accessible sensors.

When the battery monitoring system 28 is aware of the bias, and slope, of the cell pressure during a discharge or a charge operation, the pressure can be normalized by removing the bias and can be used to estimate the state of charge during a discharge or a charge operation.

Including process flows for monitoring and controlling the state of charge during both charging operations and discharge operations (the processes of FIG. 6 and FIG. 7) within the battery monitoring system, the battery monitoring system 28 is able to monitor and control the state of charge through both charging operations and discharge operations and accurately estimate the state of charge, even at extremely low state of charge levels.

With continued reference to FIGS. 1-5, FIG. 6 illustrates an exemplary state of charge estimation flow diagram 600 utilized by the battery monitoring system 28, or any similar battery controller, to monitor a state of charge of a lithium metal battery during discharge. The state of charge estimation is operated using both voltage based estimates and cell pressure based estimates. Initially the battery monitoring system 28 obtains a voltage measurement 602. The voltage measurement 602 is provided to a first state of charge estimation module 604. The state of charge estimation module 604 uses an existing voltage based estimation process to determine a first estimated state of charge of the battery pack. The voltage based estimate 606 is output from the first state of charge estimator 604 and provided to a bias module 610.

Figure 6:
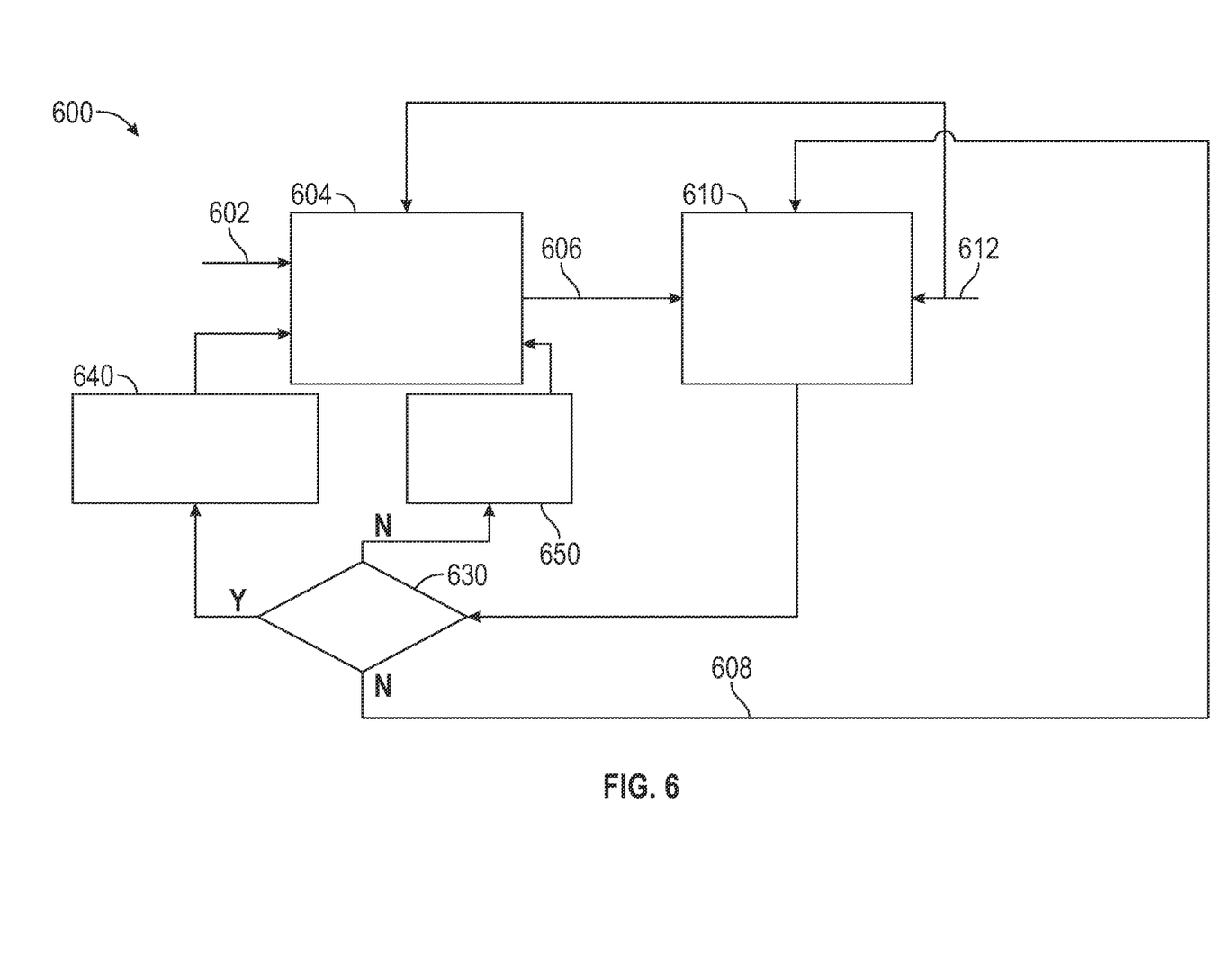
FIG. 6 is a control process for estimating a state of charge based on cell pressure during a discharge operation.

The bias module 610 also receives a direct pressure measurement 612 from the battery pack. In some operations, the direct pressure measurement is only required during a discharge operation, and thus is not received during charge operations. In other examples, the direct pressure measurement 612 is received at all times, and only applied by the bias module 610 when required to learn the bias. In yet another example, the pressure can be derived from related available sensor measurements without being directly measured.

The learned bias and slope are stored, and the estimated state of charge is provided to a state of charge check 630. The state of charge check 630 determines if the state of charge is lower than a threshold indicating that the voltage is no longer a reliable estimator. When the estimated state of charge is not below the threshold ("No"), an estimate state of charge using voltage flag 650 is provided to the state of charge estimation module 604, and the bias module 610 is provided a signal 608 to continue learning the bias and slope. The estimate state of charge using voltage flag 650 causes the state of charge estimation module 604 to estimate the state of charge based on the voltage for the next iteration.

When the estimated state of charge is equal to or below the threshold ("Yes"), the flow 600 stops learning the bias and slope, and an estimate state of charge using cell pressure flag 640 is provided to the state of charge estimation module 604, causing the state of charge estimation module 604 to use the cell pressure to estimate the state of charge for the next iteration. The state of charge estimation module 604 stores the current estimated state of charge, and the corresponding pressures and voltages, and determines the next estimated state of charge based on the measured pressure and accounting for the learned bias.

The flow 600 generally uses a conventional voltage based state of charge estimation method while the battery is being operated at a mid to high state of charge (e.g., in the first region 510 of FIG. 5). In addition, while the battery is being operated at a medium to high state of charge, the bias (upward shift due to irreversible expansion) and slope (change in pressure over time) of the pressure of the lithium metal battery is learned and coordinated with the voltage estimate. When the battery is operated at low state of charge conditions (e.g. in the second region 520 of FIG. 5), the state of charge is estimated based on the slope of the cell pressure adjusted by the learned bias.

With continued reference to FIGS. 1-6, FIG. 7 illustrates the adjusted process 700 applied during a charging or a discharging operation.

Figure 7:
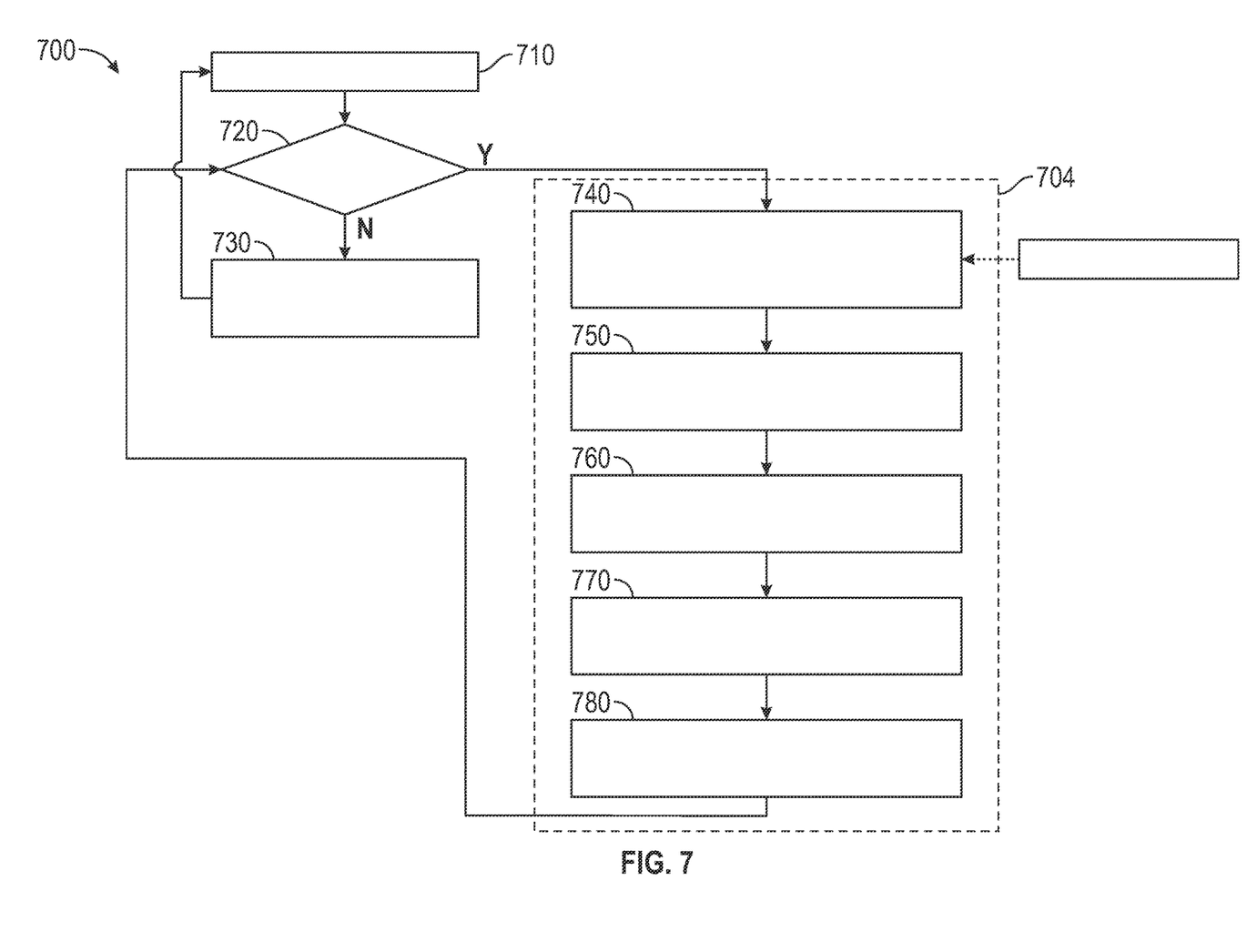
FIG. 7 is a control process for estimating a state of charge based on cell pressuring during a charging operation.

Initially, the battery monitoring system 28 (see FIG. 1) estimates the state charge using a voltage estimator 710. The battery monitoring system 28 then checks to determine if the state of charge is low or not in a low state of charge check 720. When the state of charge is not low, the check selects to use the conventional voltage based state of charge estimator in a use voltage based state of charge selector 730, and returns to the voltage estimator 710.

When the state of charge check 720 indicates that the state of charge is low, the battery monitoring system initiates a process 704 for monitoring a state of charge. Initially the battery monitoring system 28 determines an initial slope in a determine initial slope step 740 by pre-calculating the slope (a) and bias (b) in the low state of charge region using Pr=a*SOC+b, with the initial slope and bias being received from a battery specification stored in the battery monitoring system, and subsequent iterations using a stored updated slope and bias from the battery system memory.

Once the initial slope and bias have been identified, the battery monitoring system measures, or estimates, the current pressure of the battery cell ($Pr_{crt}$) in a determine current pressure step 750. As used herein, estimating the current pressure of the battery cell refers to deriving the pressure from one or more sensor measurements, where the one or more sensor measurements do not directly measure the battery cell pressure. The pressure increase due to irreversible expansion ($\Delta_{cp}$) is calculated in a calculate pressure increase step 760, the pressure is the adjusted in an adjust pressure step 770 according to $Pr_{adj}=Pr_{crt}-\Delta_{cp}$. After adjusting the pressure, the state of charge in the low state of charge region is calculated according to SOC=($Pr_{adj}$-b)/a in a calculate low state of charge step 780.

The terms "a" and "an" do not denote a limitation of quantity, but rather denote the presence of at least one of the referenced item. The term "or" means "and/or" unless clearly indicated otherwise by context. Reference throughout the specification to "an aspect", means that a particular element (e.g., feature, structure, step, or characteristic) described in connection with the aspect is included in at least one aspect described herein, and may or may not be present in other aspects. In addition, it is to be understood that the described elements may be combined in any suitable manner in the various aspects.

When an element such as a layer, film, region, or substrate is referred to as being "on" another element, it can be directly on the other element or intervening elements may also be present. In contrast, when an element is referred to as being "directly on" another element, there are no intervening elements present.

Unless specified to the contrary herein, all test standards are the most recent standard in effect as of the filing date of this application, or, if priority is claimed, the filing date of the earliest priority application in which the test standard appears.

Unless defined otherwise, technical and scientific terms used herein have the same meaning as is commonly understood by one of skill in the art to which this disclosure belongs.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A battery monitoring system for a vehicle comprising:
    a processor and a memory, the memory storing instructions for causing the processor to estimate a state of charge of a battery based on a current cell pressure of the battery while the state of charge of the battery is below a threshold state of charge and to estimate the state of charge of the battery based on a voltage output by the battery while the state of charge of the battery is greater than or equal to the threshold state of charge;
    wherein estimating the state of charge of the battery based on the current cell pressure of the battery includes estimating via a first procedure while the battery is charging, wherein the first procedure comprises:
    estimating the state of charge using a voltage based state of charge estimator and estimating the state of charge using a cell pressure based state of charge estimator;
    comparing the voltage based state of charge estimation and the cell pressure based state of change estimation;
    determining that the voltage based state of charge is accurate when a difference between the voltage based state of charge estimation and the cell pressure based state of charge estimation is below a threshold, and determining that the voltage based state of charge is inaccurate when the difference between the voltage based state of charge estimation and the cell pressure based state of charge estimation is greater than or equal to the threshold; and
    learning a bias and slope of a cell pressure response to determining that the voltage based state of change estimate is accurate, and applying the learned bias and slope of the cell pressure when estimating the state of charge using the cell pressure based state of charge estimator.

2. The battery monitoring system of claim 1, wherein estimating the state of charge of the battery based on the current cell pressure comprises estimating the state of charge based on a rate of change of the current cell pressure.

3. The battery monitoring system of claim 2, wherein the memory stores instructions configured to cause the processor to learn a cell pressure bias across multiple iterations.

4. The battery monitoring system of claim 1, wherein the current cell pressure is directly monitored.

5. The battery monitoring system of claim 1, wherein the current cell pressure is derived from at least one related sensor reading.

6. The battery monitoring system of claim 1, wherein the battery is a lithium metal battery.

7. The battery monitoring system of claim 1, wherein estimating the state of charge of the battery based on the current cell pressure of the battery includes estimating via a second procedure when the battery is discharging.

8. The battery monitoring system of claim 7, wherein the second procedure comprises:
    pre-calculating a slope a and bias b of the current cell pressure of the battery, determining a current cell pressure of the battery $Pr_{crt}$, calculating a pressure increase due to irreversible expansion ($\Delta_{cp}$), adjusting a measured pressure according to $Pr_{adj}=Pr_{crt}-\Delta_{cp}$ and calculating the state of charge (SOC) according to $SOC=(Pr_{adj}-b)/a$.

9. The battery monitoring system of claim 1, wherein the vehicle is an electrically powered vehicle.

10. The battery monitoring system of claim 9, wherein the vehicle is a hybrid vehicle.

11. A method for estimating a state of charge of a battery comprising:
    estimating a state of charge of a battery based on a current cell pressure of the battery while the state of charge of the battery is below a threshold state of charge and estimating the state of charge of the battery based on a voltage output by the battery while the battery is greater than or equal to the threshold state of charge;
    wherein estimating the state of charge of a battery based on a current cell pressure of the battery while the state of charge of the battery is below a threshold state of charge comprises estimating the state of change of the battery via a first procedure while the battery is charging and estimating the state of change of the battery via a second procedure when the battery is discharging, and
    wherein the second procedure includes re-calculating a slope a and bias b of the battery cell pressure, determining a current battery cell pressure $Pr_{crt}$, calculating a pressure increase due to irreversible expansion ($\Delta_{cp}$), adjusting a measured pressure according to $Pr_{adj}=Pr_{crt}-\Delta_{cp}$ and calculating a state of charge (SOC) according to $SOC=(Pr_{adj}-b)/a$.

12. The method of claim 11, wherein estimating the state of charge of the battery based on the current cell pressure comprises estimating the state of charge based on a rate of change of the cell pressure.

13. The method of claim 12, further comprising learning a cell pressure bias across multiple iterations and storing the learned cell pressure bias in a memory.

14. The method of claim 11, wherein the battery is a lithium metal battery.

15. The method of claim 11, wherein the first procedure comprises:
    estimating the state of charge using a voltage based state of charge estimator and estimating the state of charge using a cell pressure base state of charge estimator;
    comparing the voltage based state of charge estimation and the cell pressure based state of charge estimation; and
    determining that the voltage based state of charge is accurate when a difference between the voltage based state of charge estimation and the cell pressure based state of charge estimation is below a threshold, and determining that the voltage based stat-state of charge is inaccurate when the difference between the voltage based state of charge estimation and the cell pressure based state of charge estimation is greater than or equal to the threshold.

16. The method of claim 15, wherein the first procedure further comprises learning a bias and slope of a cell pressure in response to determining that the voltage based estimate is accurate, and applying the learned bias and slope of the cell pressure when estimating the state of charge using the cell pressure based estimator.

17. The method of claim 11, wherein the battery is an electric vehicle battery.

18. A vehicle comprising:
    a propulsion system including at least one electric motor;
    a battery system comprising a cell based battery and a battery monitoring system, wherein the battery monitoring system includes a memory and a processor, the battery monitoring system being configured to perform the process of estimating a state of charge of a battery based on a current cell pressure of the battery while the state of charge of the battery is below a threshold state of charge and estimating the state of charge of the battery based on a voltage output by the battery while the battery is greater than or equal to the threshold state of charge;
    wherein estimating the state of charge of the battery based on the current cell pressure of the battery includes estimating via a first procedure while the battery is charging, wherein the first procedure comprises:
    estimating the state of charge using a voltage based state of change estimator and estimating the state of charge using a cell pressure based state of charge estimator;
    comparing the voltage based state of charge estimation and the cell pressure based state of charge estimation;
    determining that the voltage based state of charge is accurate when a difference between the voltage based state of charge estimation and the cell pressure based state of charge estimation is below a threshold, and determining that the voltage based state of charge is inaccurate when the difference between the voltage based state of charge estimation and the cell pressure based state of charge estimation is greater than or equal to the threshold; and
    learning a bias and slope of a cell pressure in response to determining that the voltage based state of charge estimate is accurate, and applying the learned bias and slope of the cell pressure when estimating the stage of charge using the cell pressure based state of charge estimator.

19. The vehicle of claim 18, wherein estimating the state of charge of the battery based on the current cell pressure of the battery includes estimating via a first procedure while the battery is charging, and estimating via a second procedure when the battery is discharging.

20. The vehicle of claim 18, wherein the vehicle is an electrically powered vehicle.

* * * * *